(12) United States Patent
Su et al.

(10) Patent No.: US 8,094,032 B2
(45) Date of Patent: Jan. 10, 2012

(54) VOLTAGE DETECTING CIRCUIT

(75) Inventors: Chun-Nan Su, Taipei (TW); Chin-Lung Lai, Taipei (TW)

(73) Assignee: Primax Electronics Ltd., Taipei (TW)

( * ) Notice: Subject to any disclaimer, the term of this patent is extended or adjusted under 35 U.S.C. 154(b) by 596 days.

(21) Appl. No.: 12/195,903

(22) Filed: Aug. 21, 2008

(65) Prior Publication Data

US 2009/0303063 A1 Dec. 10, 2009

(30) Foreign Application Priority Data

Jun. 6, 2008 (TW) .............................. 97121041 A

(51) Int. Cl.
*G08B 21/00* (2006.01)
*G01N 27/416* (2006.01)
(52) U.S. Cl. .............. 340/636.15; 340/636.19; 340/660; 340/663; 320/134; 320/136; 324/426; 324/428; 324/429; 324/433
(58) Field of Classification Search .......... 340/635–637, 340/660–663; 320/134, 136; 324/426, 428, 324/433, 429
See application file for complete search history.

(56) References Cited

U.S. PATENT DOCUMENTS

| | | | | |
|---|---|---|---|---|
| 3,852,732 A * | 12/1974 | Yorksie et al. | ................ | 320/136 |
| 3,979,657 A * | 9/1976 | Yorksie | ......................... | 320/136 |
| 4,536,757 A * | 8/1985 | Ijntema | .................... | 340/636.15 |
| 5,760,587 A * | 6/1998 | Harvey | ......................... | 324/434 |
| 6,118,384 A * | 9/2000 | Sheldon et al. | .......... | 340/636.15 |
| 6,242,920 B1 * | 6/2001 | Nelson et al. | ................. | 324/427 |
| 6,483,275 B1 * | 11/2002 | Nebrigic et al. | .............. | 320/135 |
| 2006/0220461 A1 * | 10/2006 | Miyamoto | ...................... | 307/43 |
| 2008/0018306 A1 * | 1/2008 | Shin et al. | ..................... | 320/149 |

* cited by examiner

*Primary Examiner* — George Bugg
*Assistant Examiner* — Anne Lai
(74) *Attorney, Agent, or Firm* — Kirton & McConkie; Evan R. Witt

(57) ABSTRACT

The present invention relates to a voltage detecting circuit for detecting a voltage range of a power source. The voltage detecting circuit includes a micro controlling unit, a boost circuit and a plurality of divider resistors. The micro controlling unit includes a general input/output port and a controlling input/output port. The boost circuit provides a constant voltage. A judgment voltage is obtained according to the divider resistors, the constant voltage and a voltage of the power source. A digital level signal is issued by the general input/output port according to the judgment voltage. In response to the digital level signal, the micro controlling unit generates a corresponding prompt associated with the voltage status of the power source.

13 Claims, 2 Drawing Sheets

VOLTAGE DETECTING CIRCUIT

FIELD OF THE INVENTION

The present invention relates to a voltage detecting circuit, and more particularly to a voltage detecting circuit for detecting a voltage range of a power source.

BACKGROUND OF THE INVENTION

Recently, with increasing awareness of environmental protection, the exhausted battery should not be arbitrarily discarded but needs to be recovered because the electrolyte solution of the battery usually contains toxic and corrosive substances. If the exhausted battery is mounted within an electronic device, the weak residual electricity will be slowly consumed. Until the electricity is completely consumed, the electrolyte solution of the battery may flow out of the battery to corrode the electronic circuitry inside the electronic device. Under this instance, most users may discard the corroded electronic device as well as the battery. On the other hand, if the electrolyte solution of the battery is drained out of the electronic device, the electrolyte solution may contaminate the environment. For solving these drawbacks, a commercial electronic device usually has a voltage detecting circuit for detecting the voltage of the battery so as to realize the residual electricity contained in the battery. According to the magnitude of the residual electricity, the voltage detecting circuit issues a corresponding prompt signal to notify the user.

Referring to FIG. 1, a circuit diagram of a conventional voltage detecting circuit is schematically illustrated. The voltage detecting circuit 10 principally comprises a micro controlling unit 100, a boost circuit 101, a power source 102 and an analog/digital converter 103. The micro controlling unit 100 is connected to the boost circuit 101 and the analog/digital converter 103. The power source 102 is also connected to the boost circuit 101 and the analog/digital converter 103. The boost circuit 101 and the power source 102 are both grounded. The analog/digital converter 103 is communicated with the micro controlling unit 100 through a flat cable 108.

Please refer to FIG. 1 again. The power source 102 is a battery. The boost circuit 101 is a DC to DC converter for providing a constant voltage to the micro controlling unit 100. If the voltage inputted into the boost circuit 101 is greater than the constant voltage, the boost circuit 101 is disenabled and the input voltage is directly outputted from the boost circuit 101. Whereas, if the voltage inputted into the boost circuit 101 is smaller than the constant voltage, the constant voltage is outputted from the boost circuit 101 in order to achieve the purpose of boosting voltage. In the voltage detecting circuit 10, the voltage offered by the power source 102, which is smaller than the constant voltage, is transmitted to the boost circuit 101. The constant voltage outputted from the boost circuit 101 is transmitted to the micro controlling unit 100. The constant voltage is defined as a voltage judgment threshold value by the micro controlling unit 100. According to the voltage judgment threshold value, the analog/digital converter 103, which is connected to the micro controlling unit 100, will perform a voltage detecting process.

After the voltage judgment threshold value is defined, the voltage offered by the power source 102 is inputted into the analog/digital converter 103. The analog/digital converter 103 will compare the input voltage with the voltage judgment threshold value and then output a detected voltage. For example, if the analog/digital converter 103 is an 8-bit analog/digital converter and the voltage judgment threshold value is 3 volt, the voltage judgment threshold value (i.e. 3 volt) is divided into 256 (i.e. 2 to the power of 8) digital levels by the analog/digital converter 103. These 256 digital levels include digital values of from 0 to 255. That is, the analog voltage of 3 volt may be indicated as a digital value 255. If the voltage inputted into the analog/digital converter 103 is 1.5 volt, the analog/digital converter 103 will compare this analog input voltage (1.5 volt) with the voltage judgment threshold value (i.e. 3 volt or a digital value 255) and convert this analog input voltage into a digital value 128. Meanwhile, the analog/digital converter 103 discriminates the digital value 128 of the input voltage. After the digital value 128 is converted into the analog voltage of 1.5 volt by the analog/digital converter 103, the voltage detecting process is done.

After the voltage detecting process is done, the messages associated with the detected voltage are transmitted from the analog/digital converter 103 to the micro controlling unit 100 through the flat cable 108. The messages transmitted through the flat cable 108 include for example enabling signals, clock signals and relating data. The flat cable 108 is connected to three connecting ports 104, 105 and 106 of the micro controlling unit 100. The enabling signals, the clock signals and the data are transmitted to the micro controlling unit 100 via the connecting ports 104, 105 and 106, respectively.

The conventional voltage detecting circuit shown in FIG. 1 may be optionally connected to a liquid crystal display during the voltage detecting process. The magnitude of the detected voltage may be shown on the liquid crystal display to be viewed by the user. If the detected voltage drops down to a certain valve, a warming signal is issued by the liquid crystal display to notify the user that the power source needs to be replaced or charged.

As previously described, the conventional voltage detecting circuit uses the analog/digital converter to detect the voltage of the power source. Since the input voltage is discriminated by the analog/digital converter in multi-stages, multi-stage prompt signals may be generated to notify the user. Although the analog/digital converter is effective to discriminate the voltage of the power source, there are still some drawbacks. For example, the analog/digital converter has complicated circuitry and thus costly. In most instances, the powerful function of detecting the input voltage in multi-stages is usually unnecessary for most electronic devices. Generally, the voltage detecting circuit capable of generating three- or four-stage prompt signals is desired because the circuitry space and the cost are reduced.

Therefore, there is a need of providing a voltage detecting circuit to obviate the drawbacks encountered from the prior art.

SUMMARY OF THE INVENTION

It is an object of the present invention to provide a voltage detecting circuit for providing multi-stage prompt signals without the use of an analog/digital converter.

An object of the present invention provides a voltage detecting circuit with cost-effectiveness.

In accordance with an aspect of the present invention, there is provided a voltage detecting circuit for detecting a voltage range of a power source. The voltage detecting circuit includes a micro controlling unit, a boost circuit, a first divider resistor and a second divider resistor. The micro controlling unit includes a general input/output port for issuing a digital level signal to the micro controlling unit and a controlling input/output port for outputting a constant voltage. The boost circuit is electrically connected to the power source and the micro controlling unit for providing the constant voltage to the micro controlling unit. The first divider resistor is electrically connected to the micro controlling unit, the power source and the boost circuit. The second divider resistor is connected to the first divider resistor in series and electrically connected to the controlling input/output port of the micro controlling unit. A judgment voltage is obtained according to the first divider resistor, the second divider resistor, the constant voltage and a voltage of the power source. The digital level signal is issued by the general input/output port according to the judgment voltage. The voltage range of the power source is determined by the micro controlling unit according to a logic-level of the digital level signal. An enabling signal is generated by the micro controlling unit in response to the digital level signal.

In an embodiment, the micro controlling unit generates a first enabling signal if the digital level signal is in a high logic-level state, and the micro controlling unit generates a second enabling signal if the digital level signal is in a low logic-level state.

In an embodiment, the micro controlling unit is further electrically connected to an electronic lighting element, and the electronic lighting element emits a light beam in response to the enable signal.

In an embodiment, the electronic lighting element emits a green light beam in response to the first enable signal, and the electronic lighting element emits a green flashing light beam in response to the second enable signal.

Preferably, the electronic lighting element is a light emitting diode or a laser diode.

In an embodiment, the voltage detecting circuit further comprises a third divider resistor, which is connected to the first divider resistor in series and electrically connected to another controlling input/output port of the micro controlling unit, wherein another judgment voltage is obtained according to the first divider resistor, the third divider resistor, the constant voltage and a voltage of the power source and transmitted to the general input/output port.

In an embodiment, another digital level signal is issued by the general input/output port according to the another judgment voltage, and the voltage range of the power source is determined by the micro controlling unit according to the logic-level of the another digital level signal.

In an embodiment, the micro controlling unit generates a first enabling signal if the digital level signal is in a high logic-level state and the another is in a high logic-level state, the micro controlling unit generates a second enabling signal if the digital level signal is in a high logic-level state and the another digital level signal is in a low logic-level state, and the micro controlling unit generates a third enabling signal if the digital level signal is in a low logic-level state and the another digital level signal is in a low logic-level state.

In an embodiment, the micro controlling unit is further electrically connected to an electronic lighting assembly comprising a first electronic lighting element and a second electronic lighting element to emit light beams in response to the first, second and third enable signals. The first electronic lighting element emits a green light beam or a green flashing light beam. The second electronic lighting element emits a red light beam or a red flashing light beam.

In an embodiment, the first electronic lighting element emits a green light beam in response to the first enable signal, the first electronic lighting element emits a green flashing light beam in response to the second enable signal, and the electronic lighting element emits a red light beam in response to the third enable signal.

Preferably, the first electronic lighting element and the second electronic lighting element are light emitting diodes or laser diodes.

Preferably, the power source is a battery.

Preferably, the boost circuit is a DC to DC converter.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
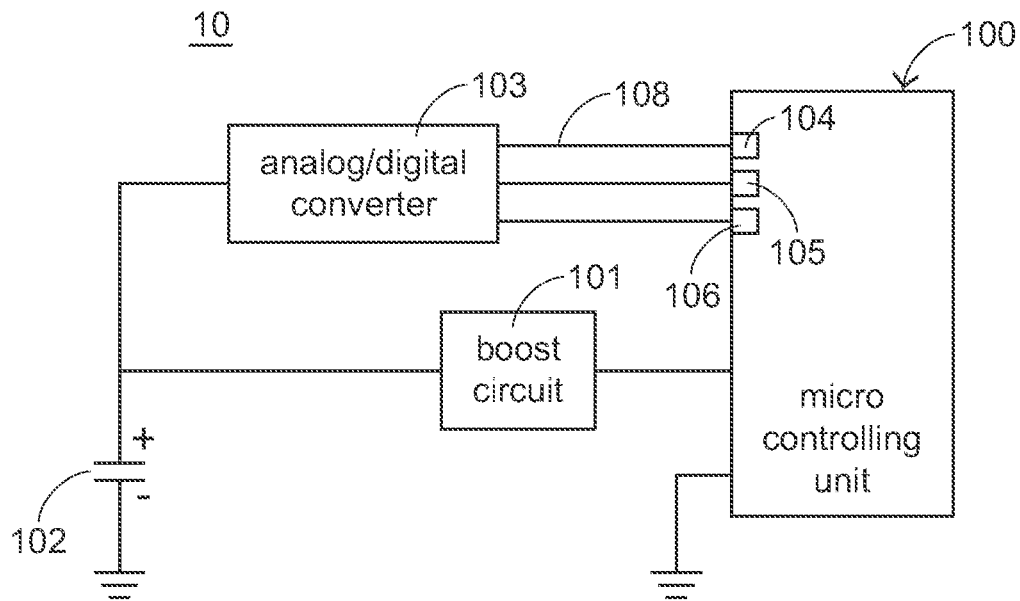
FIG. 1 is a schematic circuit diagram of a conventional voltage detecting circuit.
Figure 2:
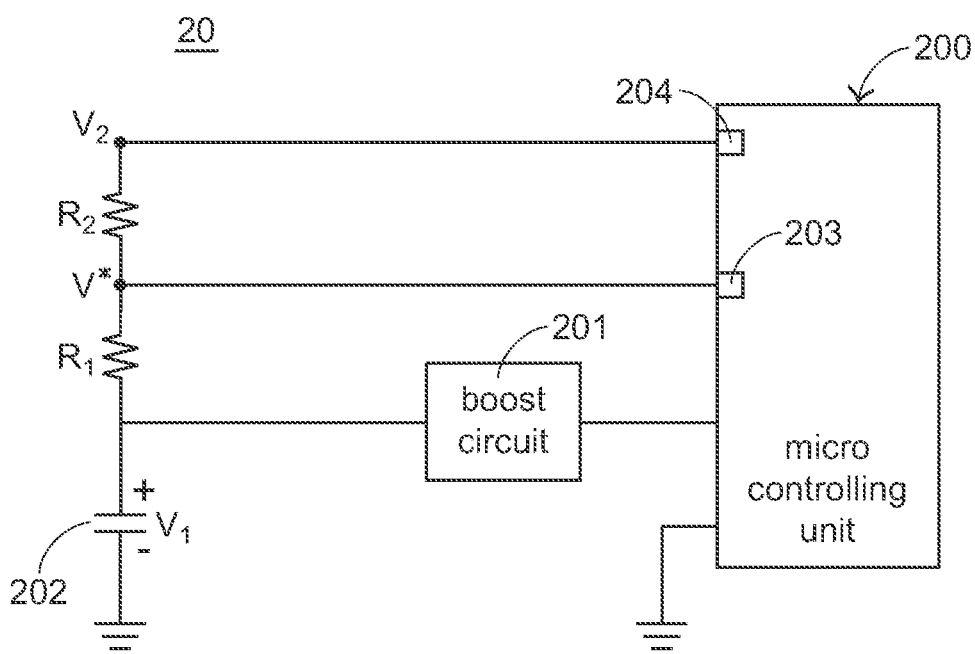
FIG. 2 is a schematic circuit diagram of a voltage detecting circuit according to a first preferred embodiment of the present invention.

FIG. 2 is a schematic circuit diagram of a voltage detecting circuit according to a first preferred embodiment of the present invention. As shown in FIG. 2, the voltage detecting circuit 20 principally comprises a micro controlling unit 200, a boost circuit 201, a power source 202, a first divider resistor R1 and a second divider resistor R2. The micro controlling unit 200 comprises a general input/output port 203 and a controlling input/output port 204. The boost circuit 201 is electrically connected to the power source 202 and the micro controlling unit 200. The first divider resistor R1 is electrically connected to the micro controlling unit 200, the power source 202 and the boost circuit 201. The second divider resistor R2 is electrically connected to the first divider resistor R1 in series, and electrically connected to the controlling input/output port 204 of the micro controlling unit 200. In addition, the micro controlling unit 200 and the power source 202 are both grounded, as is shown in FIG. 2.

In this embodiment, the boost circuit 201 is a DC to DC converter and the power source 202 is a battery. The general input/output port 203 is served as an input port and able to generate a digital level signal. In accordance with a feature of the present invention, the general input/output port 203 has a predetermined voltage judgment threshold value. For example, if the voltage inputted into the general input/output port 203 is smaller than the voltage judgment threshold value, the general input/output port 203 issues a low logic-level digital level signal. Whereas, if the voltage inputted into the general input/output port 203 is greater than the voltage judgment threshold value, the general input/output port 203 issues a high logic-level digital level signal. The controlling input/output port 204 is served as an output port. Optionally, the voltage detecting circuit 20 is electrically connected to an electronic lighting element (not shown) such as a light emitting diode or a laser diode.

The voltage detecting operations of the voltage detecting circuit 20 will be illustrated in more details as follows. In the voltage detecting circuit 20, a voltage V1 offered by the power source 202 is inputted into the boost circuit 201. The boost circuit 201 is used for providing a constant voltage V2 to the micro controlling unit 200. If the voltage V1 is smaller than the constant voltage V2, the boost circuit 201 provides the constant voltage V2 to the micro controlling unit 200. The constant voltage V2 is transmitted to the micro controlling unit 200 and then outputted from the micro controlling unit 200 through the controlling input/output port 204. Meanwhile, a voltage difference (V2−V1) is resulted between both terminals of the serially-connected divider resistors R1 and R2. According to the resistance values of the first divider resistor R1 and the second divider resistor R2, the magnitude of the constant voltage V2 and the voltage V1 of the power source 202, a judgment voltage V* is deduced from an equation: $V^*=[(V2-V1)/(R1+R2)\times R1]+V1$.

When the judgment voltage V* is inputted into the general input/output port 203, the general input/output port 203 will compare the judgment voltage V* with the predetermined voltage judgment threshold value. If the judgment voltage V* is smaller than the voltage judgment threshold value, the general input/output port 203 issues a low logic-level digital level signal. Whereas, if the judgment voltage V* is greater than the voltage judgment threshold value, the general input/output port 203 issues a high logic-level digital level signal.

For example, the voltage detecting circuit 20 is operated under the following conditions: the voltage V1 offered by the power source 202 is 1.5 volt, the constant voltage V2 offered by the boost circuit 201 is 3 volt, the first divider resistor R1 has a resistance value of 50 kOhm, the second divider resistor R2 has a resistance value of 50 kOhm, and the predetermined voltage judgment threshold value of the general input/output port 203 is 2.1 volt. According to the equation of $V^*=[(V2-V1)/(R1+R2)\times R1]+V1$, the magnitude of the judgment voltage V* (i.e. 2.25 volt) is obtained. The general input/output port 203 compares the judgment voltage V* (2.25 volt) with the voltage judgment threshold value (2.1 volt) and thus issues a high logic-level digital level signal to the micro controlling unit 200. In response to the high logic-level digital level signal, the micro controlling unit 200 generates a first enabling signal. In response to the first enabling signal, the electronic lighting element, which is connected to the voltage detecting circuit 20, emits a green light beam to notify the user that the voltage V1 offered by the power source 202 lies within a normal range. In a case that the power source 202 has been used for an extended period, the voltage V1 offered by the power source 202 drops down to for example 1 volt while the other parameters remain unchanged. According to the equation of $V^*=[(V2-V1)/(R1+R2)\times R1]+V1$, the magnitude of the judgment voltage V* (i.e. 2 volt) is obtained. The general input/output port 203 compares the judgment voltage V* (2 volt) with the voltage judgment threshold value (2.1 volt) and thus issues a low logic-level digital level signal to the micro controlling unit 200. In response to the low logic-level digital level signal, the micro controlling unit 200 generates a second enabling signal. In response to the second enabling signal, the electronic lighting element emits a green flashing light beam to notify the user that the voltage V1 offered by the power source 202 is nearly exhausted.

From the above description, the voltage detecting circuit 20 of the present invention is capable of detecting a voltage without the use of an analog/digital converter. In the above embodiment, the voltage detecting circuit can provide two-stage prompt signals. These two-stage prompt signals are still unsatisfied. Hereinafter, a voltage detecting circuit capable of providing more than two-stage prompt signals will be illustrated with reference to FIG. 3.

Figure 3:
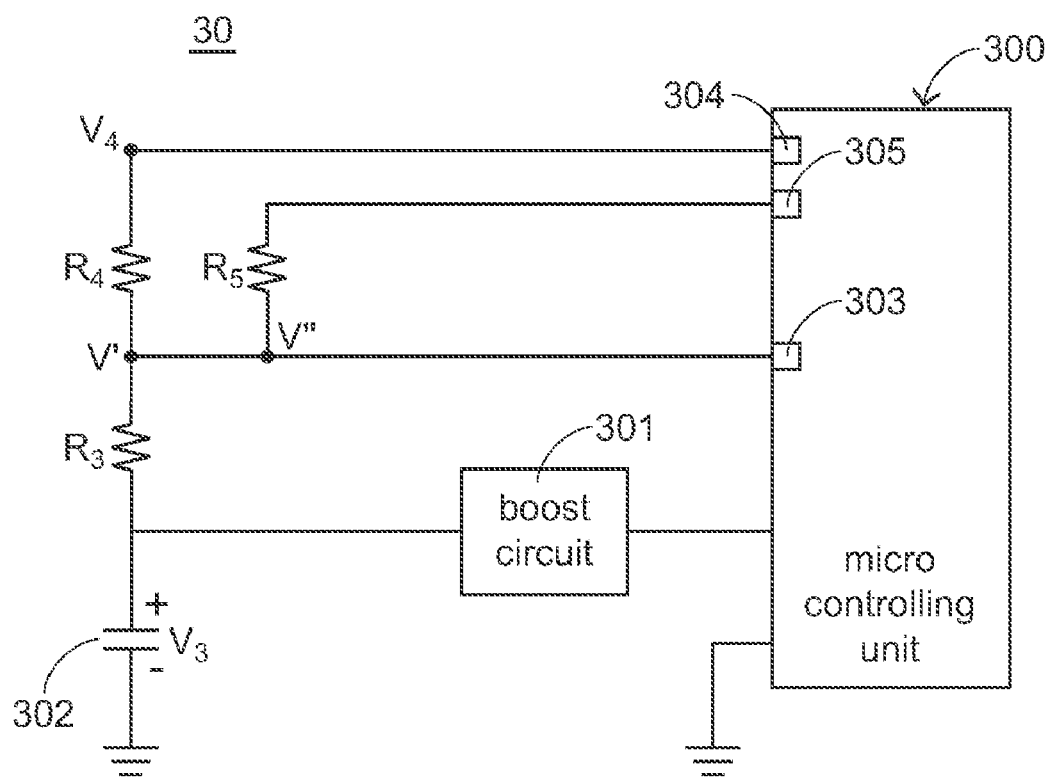
FIG. 3 is a schematic circuit diagram of a voltage detecting circuit according to a second preferred embodiment of the present invention.

FIG. 3 is a schematic circuit diagram of a voltage detecting circuit according to a second preferred embodiment of the present invention. As shown in FIG. 3, the voltage detecting circuit 30 principally comprises a micro controlling unit 300, a boost circuit 301, a power source 302, a first divider resistor R3, a second divider resistor R4 and a third divider resistor R5. The micro controlling unit 300 comprises a general input/ output port 303, a first controlling input/output port 304 and a second controlling input/output port 305. The boost circuit 301 is electrically connected to the power source 302 and the micro controlling unit 300. The first divider resistor R3 is electrically connected to the micro controlling unit 300, the power source 302 and the boost circuit 301. The second divider resistor R4 is electrically connected to the first divider resistor R3 in series, and electrically connected to the first controlling input/output port 304 of the micro controlling unit 300. The third divider resistor R5 is electrically connected to the first divider resistor R3 in series, and electrically connected to the second controlling input/output port 305 of the micro controlling unit 300. In addition, the micro controlling unit 300 and the power source 302 are both grounded. In comparison with the first preferred embodiment, the voltage detecting circuit 30 of the second preferred embodiment further comprises the third divider resistor R5 between the first divider resistor R3 and the micro controlling unit 300.

Furthermore, the voltage detecting circuit 30 is electrically connected to an electronic lighting assembly (not shown). The electronic lighting assembly comprises a first electronic lighting element and a second electronic lighting element. The first electronic lighting element may emit a green light beam or a green flashing light beam. The second electronic lighting element may emit a red light beam or a red flashing light beam.

In the voltage detecting circuit 30, a voltage V3 offered by the power source 301 is inputted into the boost circuit 301. The boost circuit 301 is used for providing a constant voltage V4 to the micro controlling unit 300. If the voltage V3 is smaller than the constant voltage V4, the boost circuit 301 provides the constant voltage V4 to the micro controlling unit 300. When the first controlling input/output port 304 is turned on but the second controlling input/output port 305 is turned off, the constant voltage V4 is transmitted to the micro controlling unit 300 and then outputted from the micro controlling unit 300 through the first controlling input/output port 304. Meanwhile, a voltage difference (V4−V3) is resulted between both terminals of the serially-connected divider resistors R3 and R4. According to the resistance values of the first divider resistor R3 and the second divider resistor R3, the magnitude of the constant voltage V4 and the voltage V3 of the power source 302, a first judgment voltage V' is deduced from an equation: $V'=[(V4-V3)/(R3+R4)\times R3]+V3$.

When the first judgment voltage V' is inputted into the general input/output port 303, the general input/output port 303 will compare the first judgment voltage V' with the predetermined voltage judgment threshold value and thus output a first digital level signal. The logic level of the first digital level signal is determined according to the relative magnitude of the first judgment voltage V' to the voltage judgment threshold value. If the first judgment voltage V' is greater than or equal to the voltage judgment threshold value, the first digital level signal is in a high logic-level state. Whereas, if the first judgment voltage V' is smaller than the voltage judgment threshold value, the first digital level signal is in a low logic-level state.

Next, under control of the micro controlling unit 300, the first controlling input/output port 304 is turned off but the second controlling input/output port 305 is turned on. Consequently, the constant voltage V4 is transmitted to the micro controlling unit 300 and then outputted from the micro controlling unit 300 through the second controlling input/output port 305. Meanwhile, a voltage difference (V4−V3) is resulted between both terminals of the serially-connected divider resistors R3 and R5. According to the resistance values of the first divider resistor R3 and the third divider resistor R5, the magnitude of the constant voltage V4 and the voltage V3 of the power source 302, a second judgment voltage V" is deduced from an equation: V"=[(V4−V3)/(R3+R5)×R3]+V3.

Similarly, when the second judgment voltage V" is inputted into the general input/output port 303, the general input/output port 303 will compare the second judgment voltage V" with the predetermined voltage judgment threshold value and thus output a second digital level signal. The logic level of the second digital level signal is determined according to the relative magnitude of the second judgment voltage V" to the voltage judgment threshold value.

For example, the voltage detecting circuit 30 is operated under the following conditions: the voltage V3 offered by the power source 302 is 1.5 volt, the constant voltage V4 offered by the boost circuit 301 is 3 volt, the first divider resistor R3 has a resistance value of 50 kOhm, the second divider resistor R4 has a resistance value of 50 kOhm, the third divider resistor R5 has a resistance value of 60 kOhm, and the predetermined voltage judgment threshold value of the general input/output port 303 is 2.1 volt. First of all, the first controlling input/output port 304 is turned on. According to the equation of V'=[(V4−V3)/(R3+R4)×R3]+V3, the magnitude of the first judgment voltage V' (i.e. 2.25 volt) is obtained. The general input/output port 303 compares the first judgment voltage V' (2.25 volt) with the voltage judgment threshold value (2.1 volt) and thus issues a high logic-level first digital level signal to the micro controlling unit 300. Next, the first controlling input/output port 304 is turned off but the second controlling input/output port 305 is turned on. According to the equation of V"=[(V4−V3)/(R3+R5)×R3]+V3, the magnitude of the second judgment voltage V" (i.e. 2.18 volt) is obtained. Since the second judgment voltage V" (i.e. 2.18 volt) is greater than the voltage judgment threshold value (2.1 volt), the second digital level signal issued from the general input/output port 303 is in a high logic-level state. In response to both of the first and second digital level signals in the high logic-level state, the micro controlling unit 300 generates a first enabling signal. In response to the first enabling signal, the first electronic lighting element of the electronic lighting assembly, which is connected to the voltage detecting circuit 30, emits a green light beam to notify the user that the voltage V3 offered by the power source 302 lies within a normal range.

In a case that the power source 302 has been used for an extended period, the voltage V3 offered by the power source 302 drops down to for example 1.2 volt while the other parameters remain unchanged. First of all, the first controlling input/output port 304 is turned on. According to the equation of V'=[(V4−V3)/(R3+R4)×R3]+V3, the magnitude of the first judgment voltage V' (i.e. 2.1 volt) is obtained. The general input/output port 303 compares the first judgment voltage V' (2.1 volt) with the voltage judgment threshold value (2.1 volt) and thus issues a high logic-level first digital level signal to the micro controlling unit 300. Next, the first controlling input/output port 304 is turned off but the second controlling input/output port 305 is turned on. According to the equation of V"=[(V4−V3)/(R3+R5)×R3]+V3, the magnitude of the second judgment voltage V" (i.e. 2.02 volt) is obtained. Since the second judgment voltage V" (i.e. 2.02 volt) is smaller than the voltage judgment threshold value (2.1 volt), the second digital level signal issued from the general input/output port 303 is in a low logic-level state. In response to the first digital level signal in the high logic-level state and the second digital level signal in the low logic-level state, the micro controlling unit 300 generates a second enabling signal. In response to the second enabling signal, the first electronic lighting element of the electronic lighting assembly, which is connected to the voltage detecting circuit 30, emits a green flashing light beam to notify the user that most of the voltage V3 offered by the power source 302 has been consumed but the power source 302 is still available.

In another case that the power source 302 has been continuously used, the voltage V3 offered by the power source 302 drops down to for example 1 volt while the other parameters remain unchanged. First of all, the first controlling input/output port 304 is turned on. According to the equation of V'=[(V4−V3)/(R3+R4)×R3]+V3, the magnitude of the first judgment voltage V' (i.e. 2 volt) is obtained. Since the s first judgment voltage V' (i.e. 2 volt) is smaller than the voltage judgment threshold value (2.1 volt), the first digital level signal issued from the general input/output port 303 is in a low logic-level state. Next, the first controlling input/output port 304 is turned off but the second controlling input/output port 305 is turned on. According to the equation of V"=[(V4−V3)/(R3+R5)×R3]+V3, the magnitude of the second judgment voltage V" (i.e. 1.91 volt) is obtained. Since the second judgment voltage V" (i.e. 1.91 volt) is smaller than the voltage judgment threshold value (2.1 volt), the second digital level signal issued from the general input/output port 303 is in a low logic-level state. In response to both of the first and second digital level signals in the low logic-level state, the micro controlling unit 300 generates a third enabling signal. In response to the third enabling signal, the second electronic lighting element of the electronic lighting assembly, which is connected to the voltage detecting circuit 30, emits a red light beam to notify the user that the voltage V3 offered by the power source 302 is nearly exhausted and the power source 302 needs to be replaced with a new one.

From the above description, it is found that the voltage detecting circuit of the present invention is capable of detecting the voltage range of the power source and generating three-stage prompt signals. If the electronic lighting assembly generates the green light beam, the user may realize the voltage range of the power source is between 1.5 volt and 1.2 volt. If the electronic lighting assembly generates the green flashing light beam, the user may realize the voltage range of the power source is between 1.2 volt and 1 volt. Whereas, if the electronic lighting assembly generates the red light beam, the user may realize the voltage range of the power source is less than 1 volt. According to different lighting situations, the user may take proper measures on the power source.

The present invention is illustrated by referring to the voltage detecting circuit generating three-stage prompt signals. Nevertheless, the voltage detecting circuit of the present invention is capable of providing more than three-stage prompt signals by increasing the number of divider resistors. In addition to the electronic lighting elements, the voltage detecting circuit of the present invention may be electrically connected to a liquid crystal display or other electronic component having the capability of receiving signal and outputting prompt signals. Since the voltage detecting circuit of the present invention can detect the voltage range of the power source by simply connecting the divider resistors in series or in parallel with each other, the circuitry layout of the voltage detecting circuit is simple and occupies less space. In addition, for a purpose of power management, the prompt signals may be increased as required. More especially, the voltage detecting circuit of the present invention can achieve functions similar to the analog/digital converter in a very cost-effective manner.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage detecting circuit for detecting a voltage range of a power source, said voltage detecting circuit comprising:
   a micro controlling unit comprising a general input/output port for issuing a digital level signal to said micro controlling unit and a controlling input/output port for outputting a constant voltage; and
   a boost circuit electrically connected to said power source and said micro controlling unit for providing said constant voltage to said micro controlling unit;
   a first divider resistor electrically connected to said micro controlling unit, said power source and said boost circuit; and
   a second divider resistor connected to said first divider resistor in series and electrically connected to said controlling input/output port of said micro controlling unit, wherein a judgment voltage is obtained according to said first divider resistor, said second divider resistor, said constant voltage and a voltage of said power source, said digital level signal is issued by said general input/output port according to said judgment voltage, said voltage range of said power source is determined by said micro controlling unit according to a logic-level of said digital level signal, and an enabling signal is generated by said micro controlling unit in response to said digital level signal.

2. The voltage detecting circuit according to claim 1 wherein said micro controlling unit generates a first enabling signal if said digital level signal is in a high logic-level state, and said micro controlling unit generates a second enabling signal if said digital level signal is in a low logic-level state.

3. The voltage detecting circuit according to claim 2 wherein said micro controlling unit is further electrically connected to an electronic lighting element, and said electronic lighting element emits a light beam in response to said enable signal.

4. The voltage detecting circuit according to claim 3 wherein said electronic lighting element emits a green light beam in response to said first enable signal, and said electronic lighting element emits a green flashing light beam in response to said second enable signal.

5. The voltage detecting circuit according to claim 3 wherein said electronic lighting element is a light emitting diode or a laser diode.

6. The voltage detecting circuit according to claim 1 wherein said voltage detecting circuit further comprises a third divider resistor, which is connected to said first divider resistor in series and electrically connected to another controlling input/output port of said micro controlling unit, wherein another judgment voltage is obtained according to said first divider resistor, said third divider resistor, said constant voltage and a voltage of said power source and transmitted to said general input/output port.

7. The voltage detecting circuit according to claim 6 wherein another digital level signal is issued by said general input/output port according to said another judgment voltage, and said voltage range of said power source is determined by said micro controlling unit according to said logic-level of said another digital level signal.

8. The voltage detecting circuit according to claim 7 wherein said micro controlling unit generates a first enabling signal if said digital level signal is in a high logic-level state and said another is in a high logic-level state, said micro controlling unit generates a second enabling signal if said digital level signal is in a high logic-level state and said another digital level signal is in a low logic-level state, and said micro controlling unit generates a third enabling signal if said digital level signal is in a low logic-level state and said another digital level signal is in a low logic-level state.

9. The voltage detecting circuit according to claim 8 wherein said micro controlling unit is further electrically connected to an electronic lighting assembly comprising a first electronic lighting element and a second electronic lighting element to emit light beams in response to said first, second and third enable signals, wherein said first electronic lighting element emits a green light beam or a green flashing light beam, and said second electronic lighting element emits a red light beam or a red flashing light beam.

10. The voltage detecting circuit according to claim 9 wherein said first electronic lighting element emits a green light beam in response to said first enable signal, said first electronic lighting element emits a green flashing light beam in response to said second enable signal, and said electronic lighting element emits a red light beam in response to said third enable signal.

11. The voltage detecting circuit according to claim 9 wherein said first electronic lighting element and said second electronic lighting element are light emitting diodes or laser diodes.

12. The voltage detecting circuit according to claim 1 wherein said power source is a battery.

13. The voltage detecting circuit according to claim 1 wherein said boost circuit is a DC to DC converter.

* * * * *